(12) United States Patent  
Boone (10) Patent No.: US 6,449,150 B1
(45) Date of Patent: Sep. 10, 2002

(54) METHOD AND SYSTEM FOR COOLING A CARD SHELF

(75) Inventor: Earl W. Boone, Round Rock, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/711,730

(22) Filed: Nov. 13, 2000

(51) Int. Cl.[7] .................................................. H05K 7/20
(52) U.S. Cl. ........................ 361/694; 361/690; 361/692; 361/704; 361/720; 361/721; 174/16.1; 165/104.33; 165/185; 454/184
(58) Field of Search ................................. 361/687, 688, 361/689, 690, 692, 694, 695, 719–721, 727; 174/15.1, 16.1, 35 R; 165/80.3, 122, 164.33; 454/184

(56) References Cited

U.S. PATENT DOCUMENTS

| | | | | | |
|---|---|---|---|---|---|
| 4,672,509 A | * | 6/1987 | Speraw | ........................ | 361/687 |
| 5,034,852 A | * | 7/1991 | Rosenberg | .................. | 361/690 |
| 5,528,455 A | * | 6/1996 | Miles | ........................ | 361/695 |
| 5,544,012 A | * | 8/1996 | Koike | ........................ | 361/695 |
| 5,684,674 A | * | 11/1997 | Yin | .............................. | 361/695 |
| 5,892,654 A | * | 4/1999 | Worden, Jr. | .................. | 361/690 |
| 5,928,076 A | * | 7/1999 | Clements et al. | ........... | 454/184 |
| 5,943,219 A | * | 8/1999 | Bellino et al. | .............. | 361/816 |
| 6,052,282 A | * | 4/2000 | Sugiyama et al. | .......... | 361/690 |
| 6,163,454 A | * | 12/2000 | Strickler | ..................... | 361/695 |
| 6,211,458 B1 | * | 4/2001 | Mitchell et al. | .......... | 174/35 R |
| 6,297,950 B1 | * | 10/2001 | Erwin | ........................ | 361/685 |
| 6,330,156 B1 | * | 12/2001 | Cresse | ........................ | 361/695 |

* cited by examiner

*Primary Examiner*—Boris Chervinsky
(74) *Attorney, Agent, or Firm*—Baker Botts L.L.P.

(57) ABSTRACT

A method and system for cooling a card shelf includes a backplane, a plurality of side support members disposed proximate the backplane, a top support member disposed proximate the backplane, and a bottom support member disposed opposite the top support member. The plurality of side support members, the top support member, and the bottom support member form a shelf area configured to receive electronic cards. At least one of the electronic cards includes a cover plate having an inlet operable to receive an airflow to dissipate thermal energy generated by the electronic card. The system may also include a filter to filter the airflow entering the inlet and a diffuser to diffuse the airflow about the electronic card in a desired pattern.

41 Claims, 5 Drawing Sheets

FIG. 8

METHOD AND SYSTEM FOR COOLING A CARD SHELF

TECHNICAL FIELD OF THE INVENTION

The present invention relates in general to the field of modular electronic systems, and more particularly to a method and system for cooling a card shelf.

BACKGROUND OF THE INVENTION

Modular electronic systems are generally configured as a card shelf to optimize space efficiency within a central office or other similar facility. Card shelves include individual plug-in electronic module cards having different functions that communicate across a backplane. The electronic cards may have different thicknesses depending upon the amount of electronic circuitry contained in each electronic card. The electronic cards may also have flanges on the top and bottom which fit into grooves in the card shelf for sliding the electronic cards into the card shelf and plugging the electronic cards into connectors located in the backplane of the card shelf.

During operation, the electronic cards generate thermal energy, causing the electronic cards to retain heat. Because high temperature levels may impact the operational effectiveness of the electronic cards, the electronic cards must be cooled to prevent a malfunction of the electronic card. Active or passive cooling methods may be employed. For example, the card shelf may also include an open or perforated top and bottom portion to allow thermal energy generated by the electronic cards during operation to escape the card shelf. Additionally, the card shelf may include a fan assembly for directing airflow through the card shelf to dissipate thermal energy generated by the electronic cards during operation. The fan assemblies may include air filters to purify air and remove harmful dust and other contaminants.

Known card shelves also present certain other drawbacks. For example, to maximize space within a card shelf, electronic cards are placed in close proximity to one another. As a result, dissipation of thermal energy generated by the electronic cards during operation may be difficult or inadequate to maintain proper operation of the electronic cards. Thermal energy generated by the electronic cards may cause a fire to ignite within the card shelf thereby damaging one or more of the electronic cards.

Including fan assemblies in known card shelves also presents certain drawbacks. For example, a partially filled card shelf may cause airflow generated by the fan assembly to be directed around the electronic cards to areas of less resistance. Although dummy cards may be inserted into the card shelf to compensate for misdirected airflow, a variety of sizes of dummy cards must be maintained to replace removed electronic cards or fill open areas in the card shelf. Furthermore, airflow generated by the fan assembly may cause acceleration and/or propagation of a fire ignited within the card shelf.

SUMMARY OF THE INVENTION

The present invention provides an improved method and system for cooling a card shelf that substantially eliminates or reduces the disadvantages and problems associated with previous systems and methods. In particular, inlets are provided in the electronic card cover plates for receiving an airflow to passively cool the electronic cards during operation.

In accordance with one embodiment of the present invention, a method for dissipating thermal energy from a card shelf includes providing an electronic card disposed in the card shelf and receiving an airflow through an inlet disposed in a cover plate of the electronic card. The method also includes passively passing the airflow adjacent a circuit board of the electronic card to dissipate the thermal energy generated by the electronic card.

According to another embodiment of the present invention, a card shelf includes a backplane and a plurality of side support members disposed proximate the backplane. The card shelf also includes a top support member disposed proximate the backplane and a bottom support member disposed opposite the top support member. The plurality of side support members, the top support member, and the bottom support member form a shelf area configured to receive electronic cards. At least one of the electronic cards comprises a cover plate having an inlet operable to receive an airflow to dissipate thermal energy generated by the electronic card.

In accordance with yet another embodiment of the present invention, an electronic card for a card shelf includes a circuit board having a plurality of electronic devices coupled thereto, and a cover plate coupled to the circuit board. The electronic card also includes an inlet disposed in the cover plate. The inlet is operable to receive an airflow to dissipate thermal energy generated by the electronic devices.

Technical advantages of the present invention include providing an improved method and system for cooling a card shelf. In particular, airflow inlets are provided at a lower level of the cards. This allows airflow to enter the card shelf in close proximity to the location of the electronic devices of the electronic card that are to be cooled. Additionally, airflow inlets provided in the electronic cards substantially alleviates the requirement for other cooling devices or structures near the lower portion of the card shelf, thereby creating additional vertical length of the electronic card for the inclusion of additional components and functionality of the electronic card.

Another technical advantage of the present invention includes providing an improved cooling system for a card shelf. In particular, a filter and air inlets are provided at the front of the card shelf. This allows for easier user observation of the air filter which, in turn, leads to more frequent cleaning as the air filter is more readily observable and accessible to the user. Additionally, by locating the filter in front of the card shelf, and by maintaining proper maintenance of the filter, the card shelf life itself is extended.

Still another technical advantage includes providing an improved cooling system for electronic cards. In particular, a filter/diffuser assembly includes a diffuser component which extends into the interior of the card shelf. The diffuser component serves to diffuse the airflow entering the card shelf through the airflow inlets such that the airflow is distributed substantially evenly about the electronic card or directed towards the warmest or most thermally active components of the electronic card. Thus, the efficiency of the cooling method increases, thereby allowing for a greater number of components on each card and larger cards.

Other technical advantages of the present invention will be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
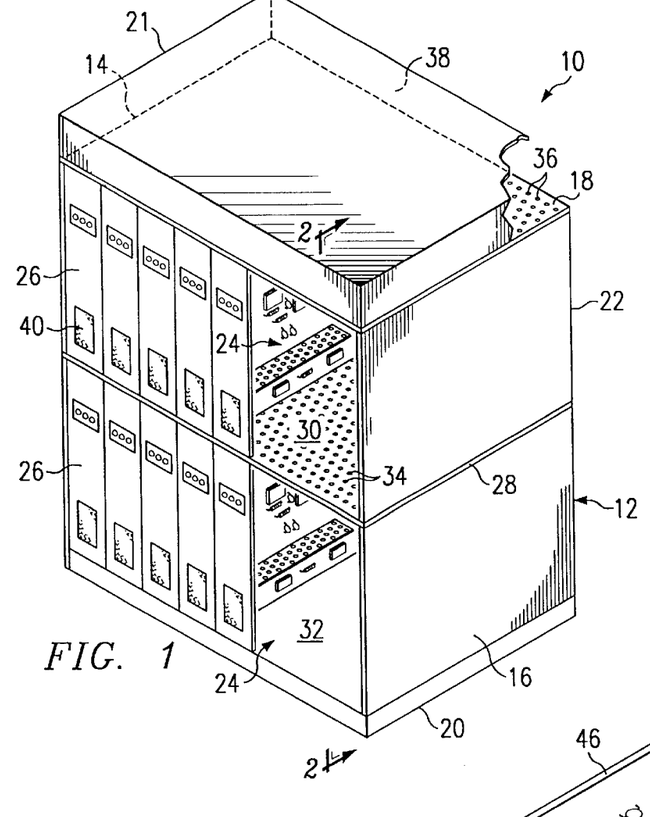
FIG. 1 is a diagram illustrating a card shelf in accordance with an embodiment of the present invention.

FIG. 1 is a diagram illustrating a card shelf assembly 10 in accordance with an embodiment of the present invention. Card shelf assembly 10 includes a card shelf 12 having side support members 14 and 16, a top support member 18, a bottom support member 20, and a cover 21. Side support members 14 and 16, top support member 18, and bottom support member 20 are disposed proximate each other and a backplane 22 to form an electronic card receiving area 24 for electronic cards 26. Electronic card receiving area 24 may include slots, dividers or other suitable devices (not explicitly shown) for aligning a connector (not explicitly shown) on a rearwardly disposed portion of an electronic card 26 with a corresponding connector (not explicitly shown) located on backplane 22 of card shelf 12. Thus, in operation, electronic cards 26 may be slid into electronic card receiving area 24 and plugged into a corresponding connector on backplane 22.

Card shelf 12 may also include a medially located support member 28 disposed between top support member 18 and bottom support member 20 forming an upper portion 30 and a lower portion 32 of the electronic card receiving area 24. Support member 28 may include apertures or perforations 34 for allowing an airflow to travel upwardly from lower portion 32 to upper portion 30 to dissipate thermal energy generated by the electronic cards 24. Additionally, top support member 18 may include apertures or perforations 36 for allowing the airflow to exit the card shelf 12 for dissipating the thermal energy generated by the electronic cards 24. Top support member 18 and cover 21 may also be disposed relative to side support members 14 and 16 and backplane 22 to form a plenum 38 for allowing the airflow to exit a rearwardly disposed portion of the card shelf 12.

As illustrated in FIG. 1, the electronic cards 26 include an airflow inlet 40 for receiving an airflow to dissipate the thermal energy generated by the electronic cards 24 during operation. In operation, the thermal energy generated by the electronic cards 24 travels upwardly within card shelf 12, thereby drawing air outside the card shelf 12 into the airflow inlets 40. The airflow entering the airflow inlets 40 travels upwardly adjacent the electronic cards 24 and is then exhausted through perforations 36 and plenum 38. Thus, the electronic cards 24 are cooled by a passive airflow through card shelf 12.

Figure 2:
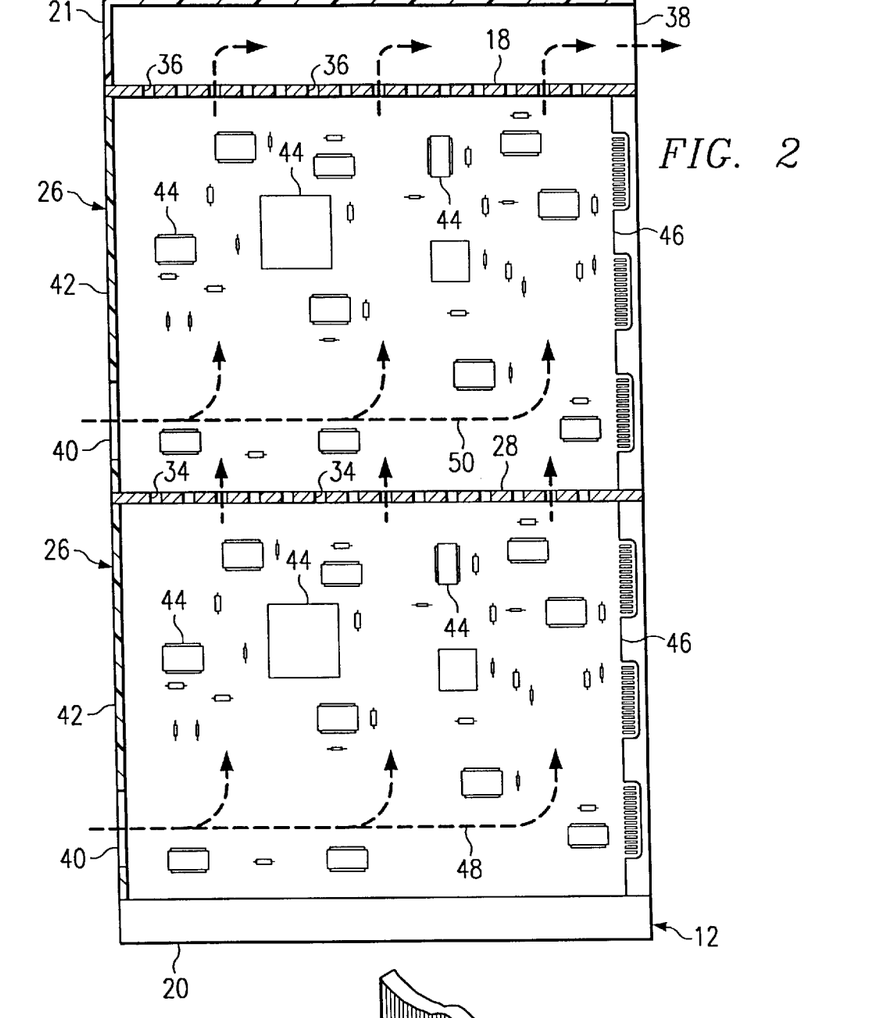
FIG. 2 is a diagram illustrating airflow paths through the card shelf of FIG. 1 in accordance with an embodiment of the present invention.

FIG. 2 is a diagram illustrating airflow paths adjacent two stacked electronic cards 26 in accordance with an embodiment of the present invention. However, it should be understood that other configurations of card shelves 12 may be used, including, without limitation, a card shelf 12 configured to receive a single row of electronic cards 26 which are not stacked vertically, but which may be elongated vertically.

Each of the electronic cards 26 illustrated in FIG. 2 includes an inlet 40 disposed in a front panel or cover plate 42 of each of the respective electronic cards 26. In this embodiment, each inlet 40 is disposed in a lower portion of the cover plate 42; however, inlets 40 may be otherwise located relative to electronic cards 26 to accommodate a desired airflow path into the card shelf 12 to dissipate thermal energy generated by the electronic cards 26. Each electronic card 26 includes a plurality of electronic devices 44 coupled to a side panel or circuit board 46 which generate thermal energy during operation. The circuit board 46 is coupled to the cover plate 42 such that the electronic card 26 may be inserted into and removed from the card shelf 12 as a modular unit.

In operation, thermal energy generated by the electronic devices 44 travels upwardly within card shelf 12, thereby drawing in the airflow through inlets 40, indicated generally at 48 for the lower electronic card 26 and 50 for the upper electronic card 26. The airflow entering inlets 40 is generally cooler than the environment within card shelf 12, thereby dissipating the thermal energy generated by the electronic devices 44. As the airflow enters inlets 40, the airflow travels upwardly via airflow paths 48 and 50 and exits the card shelf 12 through perforations 36 in top support member 18 and/or through plenum 38. As described above, the airflow path 48 travels upwardly and through perforations 34 in support member 28. Thus, the present invention passively dissipates the thermal energy generated by the electronic card 26 by receiving an airflow through inlets 40 and dissipating the thermal energy generated by the electronic card 26.

Figure 3:
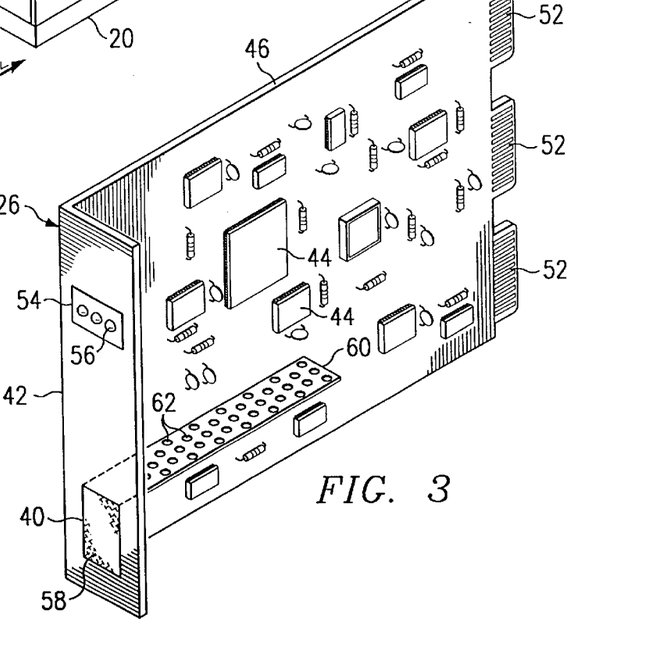
FIG. 3 is a diagram illustrating an electronic card in accordance with an embodiment of the present invention.

FIG. 3 is a diagram illustrating electronic card 26 in accordance with an embodiment of the present invention. In this embodiment, electronic card 26 includes the cover plate 42 coupled to circuit board 46. Circuit board 46 includes electronic devices 44 coupled thereto and a plurality of connectors 52 extending rearwardly from circuit board 46 for engaging corresponding connector receiving units (not explicitly shown) on backplane 22.

In the embodiment illustrated in FIG. 3, the cover plate 42 includes a single inlet 40 disposed in a lower portion of cover plate 42. However, various quantities of inlets 40 may be disposed in cover plate 42 to accommodate various cooling requirements for electronic card 26. Cover plate 42 may also include a status display 54 having one or more indicator lights 56 for displaying or indicating the status of various operating states of the electronic card 26.

In the illustrated embodiment, electronic card 26 also includes an electromagnetic emissions reduction screen 58 disposed in inlet 40 and a diffuser 60 to distribute the airflow received through inlet 40 substantially evenly about circuit board 46. Electromagnetic emissions reduction screen 58 curtails or shields the emission of electromagnetic energy from electronic card 26 through inlet 40. Screen 58 also curtails or substantially reduces the emission of electromagnetic energy from other electronic cards 26 residing in card shelf 12 through inlet 40.

Diffuser 60 is disposed adjacent circuit board 46 substantially orthogonal to circuit board 46 and cover plate 42.

Diffuser 60 may be coupled to cover plate 42 and/or circuit board 46 and extends rearwardly from cover plate 42 a predetermined distance toward backplane 22 to accommodate a desired airflow pattern about circuit board 46. For example, diffuser 60 includes a plurality of apertures or perforations 62 for allowing a portion of the airflow entering inlet 40 to pass through a portion of diffuser 60. Apertures 62 are disposed in a predetermined pattern and spacing to accommodate the desired airflow through diffuser 60. Additionally, diffuser 60 may be constructed having a predetermined length extending rearwardly from cover plate 42 to accommodate a desired volume of airflow about a rearward portion 64 of diffuser 60. For example, diffuser 60 may extend rearwardly a predetermined distance from cover plate 42 such that a portion of the airflow entering inlet 40 passes through apertures 62 while a remaining portion of the airflow entering inlet 40 passes around rearward portion 64 of diffuser 60. The resulting airflow patterns about circuit board 46 will be illustrated in greater detail in connection with FIG. 4.

Figure 4:
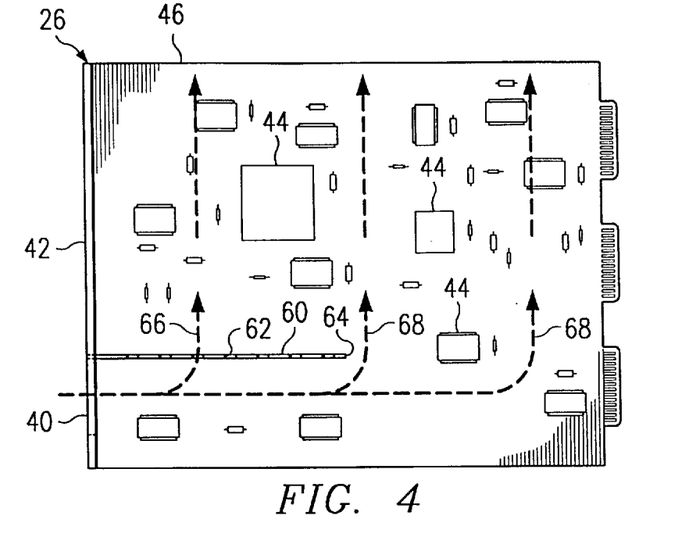
FIG. 4 is a diagram illustrating an airflow path adjacent the electronic card of FIG. 3 in accordance with an embodiment of the present invention.

FIG. 4 is a diagram illustrating an airflow pattern about electronic card 26 illustrated in FIG. 3 in accordance with an embodiment of the present invention. As illustrated in FIG. 4, diffuser 60 is medially disposed relative to a vertical height of electronic card 26. However, diffuser 60 may be located at other vertical positions relative to a vertical height of electronic card 26 to accommodate a desired airflow pattern about electronic card 26 and to accommodate various sizes of inlet 40.

In operation, airflow enters inlet 40 and travels upwardly adjacent circuit board 46. A portion of the airflow, indicated generally at 66, passes upwardly through apertures 62 of diffuser 60 to dissipate thermal energy generated by electronic devices 44 disposed in close proximity to cover plate 42. A remaining portion of the airflow received through inlet 40, indicated generally at 68, passes rearwardly of a rearward portion 64 of diffuser 60 to dissipate thermal energy generated by electronic devices 44 disposed along lower and rearward portions of circuit board 46. Thus, diffuser 60 may be configured to accommodate desired airflow volumes and patterns about electronic card 26. Further, diffuser 60 may be configured and positioned on electronic card 26 to direct the airflow entering inlet 40 to the electronic devices 44 generating greater amounts of thermal energy, thereby providing tailored cooling for each electronic card 26.

Figure 5:
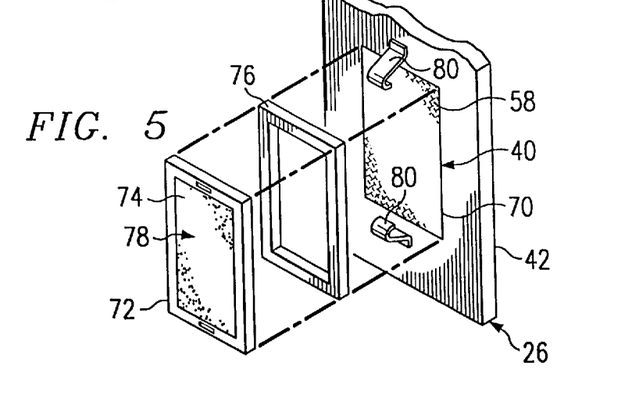
FIG. 5 is a diagram illustrating an exploded view of an electronic card in accordance with an embodiment of the present invention.

FIG. 5 is a diagram illustrating an exploded view of an electronic card 26 in accordance with an embodiment of the present invention. In the embodiment illustrated in FIG. 5, electronic card 26 includes inlet 40 disposed in a generally lower portion of cover plate 42. For example, inlet 40 may extend from a lower portion of cover plate 42 upwardly to generally one third to one half a vertical distance of cover plate 42 to accommodate receiving a desired airflow volume through inlet 40 and upward travel of the airflow adjacent circuit board 46. However, inlet 40 may be otherwise configured to accommodate a desired volume of airflow through inlet 40 to dissipate the thermal energy generated by electronic card 26.

In the embodiment illustrated in FIG. 5, inlet 40 comprises a generally rectangular-shaped opening 70 formed in cover plate 42 for receiving the airflow through inlet 40. However, inlet 40 may be constructed having other suitable geometric or design configurations, for example, without limitation, a plurality of apertures. Electromagnetic emissions reduction screen 58 is constructed to cooperate with the opening 70 to curtail or substantially prevent electromagnetic emissions from electronic cards 26 from passing through inlet 40. Electronic card 26 also includes a frame 72, a filter 74, and a gasket 76.

In operation, gasket 76 is disposed about a periphery of inlet 40 to substantially prevent airflow from entering inlet 40 and bypassing filter 74. Gasket 76 may be constructed from suitable flexible sealing materials such as plastic, rubber, or other suitable sealing materials. Filter 74 is disposed within an airflow receiving area 78 of frame 72 and extends a sufficient width and height to filter the airflow entering inlet 40. Frame 72 extends about a periphery of inlet 40 and is secured to cover plate 42 using clips 80; however, other suitable fastening devices or methods may be used to secure frame 72 to cover plate 42. In operation, frame 72 is secured to cover plate 42 to position filter 74 over inlet 40 and secure gasket 76 about inlet 40. Thus, electronic card 26 may be configured to filter the airflow entering electronic card 26 to substantially prevent contamination of electronic card 26. Additionally, locating filter 74 in a visible area relative to electronic card 26 provides visibility and enhances periodic inspection and replacement of filter 74.

Figure 6:
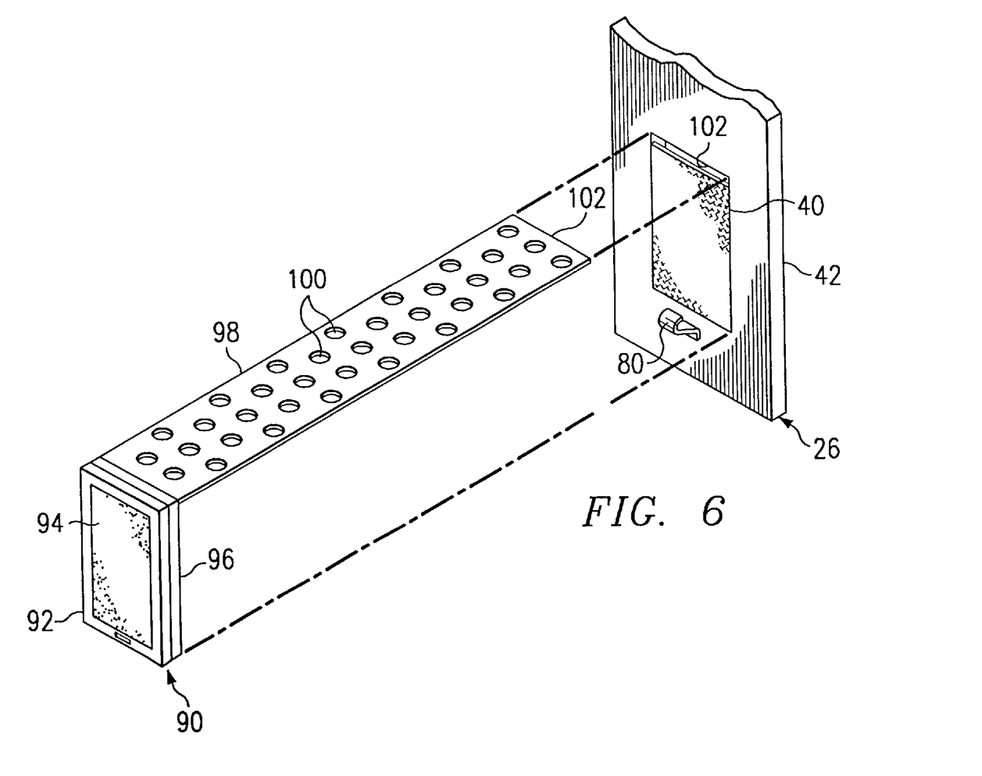
FIG. 6 is a diagram illustrating a filter/diffuser assembly in accordance with an embodiment of the present invention.

FIG. 6 is a diagram illustrating a filter/diffuser assembly 90 in accordance with an embodiment of the present invention. Filter/diffuser assembly 90 includes a frame 92, a filter 94, a gasket 96, and a diffuser 98. As illustrated in FIG. 6, filter/diffuser assembly 90 is configured as a modular unit that may be removably coupled to an electronic card 26 to provide a desired airflow pattern and volume to dissipate the thermal energy generated by electronic card 26 and filter the airflow entering the electronic card 26 through inlet 40. For example, as described above in connection with FIGS. 3–5, diffuser 98 includes a plurality of apertures 100 and extends rearwardly from frame 92 a predetermined distance such that a portion of the airflow entering inlet 40 passes through apertures 100 and a remaining portion of the airflow passes about a rearward portion 102 of diffuser 98. Filter 94 filters the airflow entering inlet 40 and gasket 96 substantially prevents the airflow from bypassing filter 94.

In operation, filter/diffuser assembly 90 is removably coupled to electronic card 26 by inserting the diffuser 98 of filter/diffuser assembly 90 through an opening 102 formed in cover plate 42. Opening 102 may be positioned on cover plate 42 to position the diffuser 98 in a desired location relative to circuit board 46. Frame 92 may be coupled to cover plate 42 using fasteners, clips, or other suitable fastening devices. Thus, filter/diffuser assembly 90 may be easily inspected and removed to accommodate cleaning, replacement or substitution of another filter/diffuser assembly 90.

Figure 7:
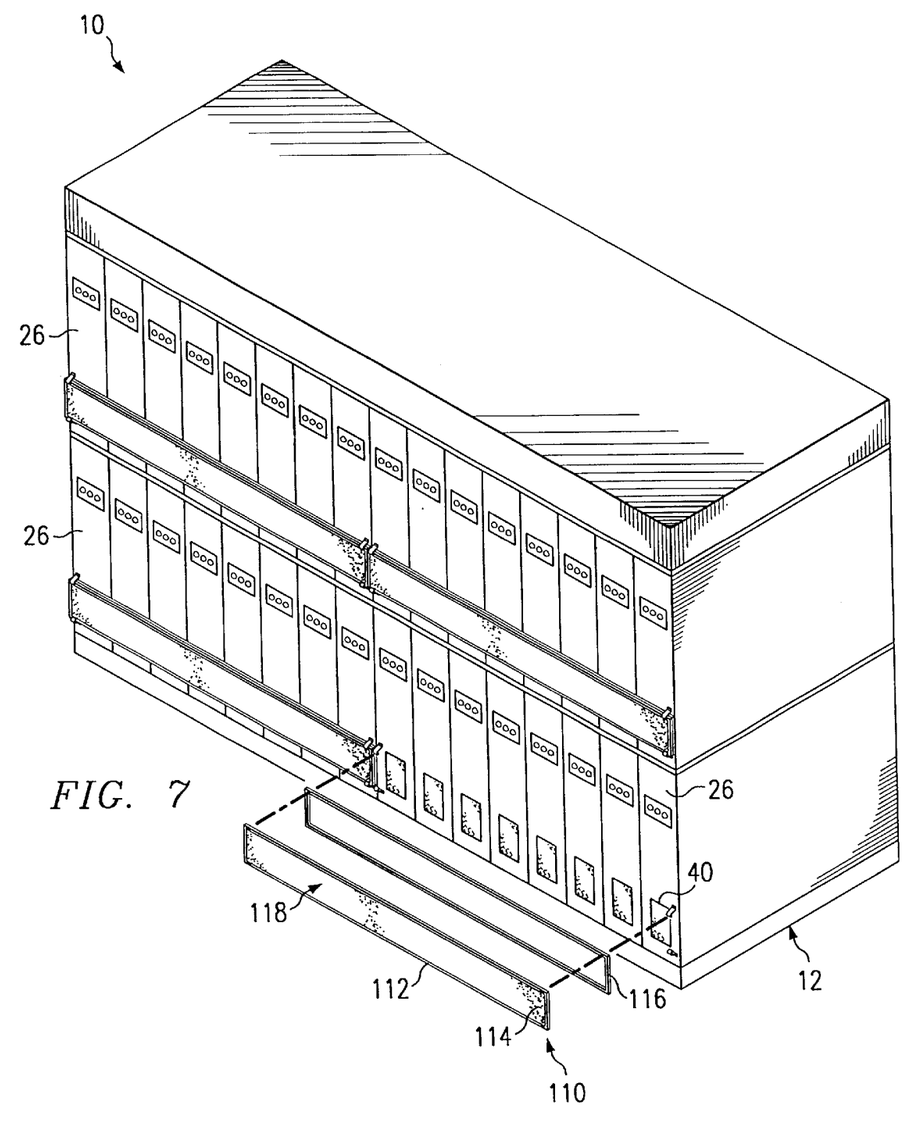
FIG. 7 is a diagram illustrating a card shelf in accordance with another embodiment of the present invention.

FIG. 7 is a diagram illustrating card shelf assembly 10 in accordance with another embodiment of the present invention. In this embodiment, a plurality of electronic cards 26 each having inlets 40 are disposed adjacent each other within card shelf 12. A filter assembly 110 is disposed relative to the electronic cards 26 such that filter assembly 110 filters the airflow entering each of a set of the electronic cards 26. For example, filter assembly 110 may be removably coupled to two outer-disposed electronic cards 26 of a series or set of electronic cards 26 such that the filter assembly 110 extends over multiple electronic cards 26, thereby filtering the airflow entering the inlets 40 of the electronic cards 26. Filter assembly 110 may be removably coupled to the electronic cards 26 using fasteners, clips, or other suitable fastening devices. However, filter assembly 110 may be otherwise positioned and secured to filter a series of electronic cards 26, for example, but not limited to, securing filter assembly 110 to various components of card shelf 12.

In the embodiment illustrated in FIG. 7, filter assembly 110 includes a frame 112, a filter 114, and a gasket 116. Gasket 116 is configured to extend about the periphery of the inlets 40 of the set of electronic cards 26 to substantially prevent the airflow from bypassing the filter 114. The filter 114 is disposed within an airflow receiving area 118 of frame 112 to filter the airflow entering inlets 40. The frame 112 extends about the periphery of the inlets 40 of the electronic cards 26 such that filter assembly 110 filters the airflow entering a plurality of electronic cards 26. Thus, filter assembly 110 may be visually inspected and periodically replaced to accommodate enhanced filtering for a plurality of electronic cards 26.

Figure 8:
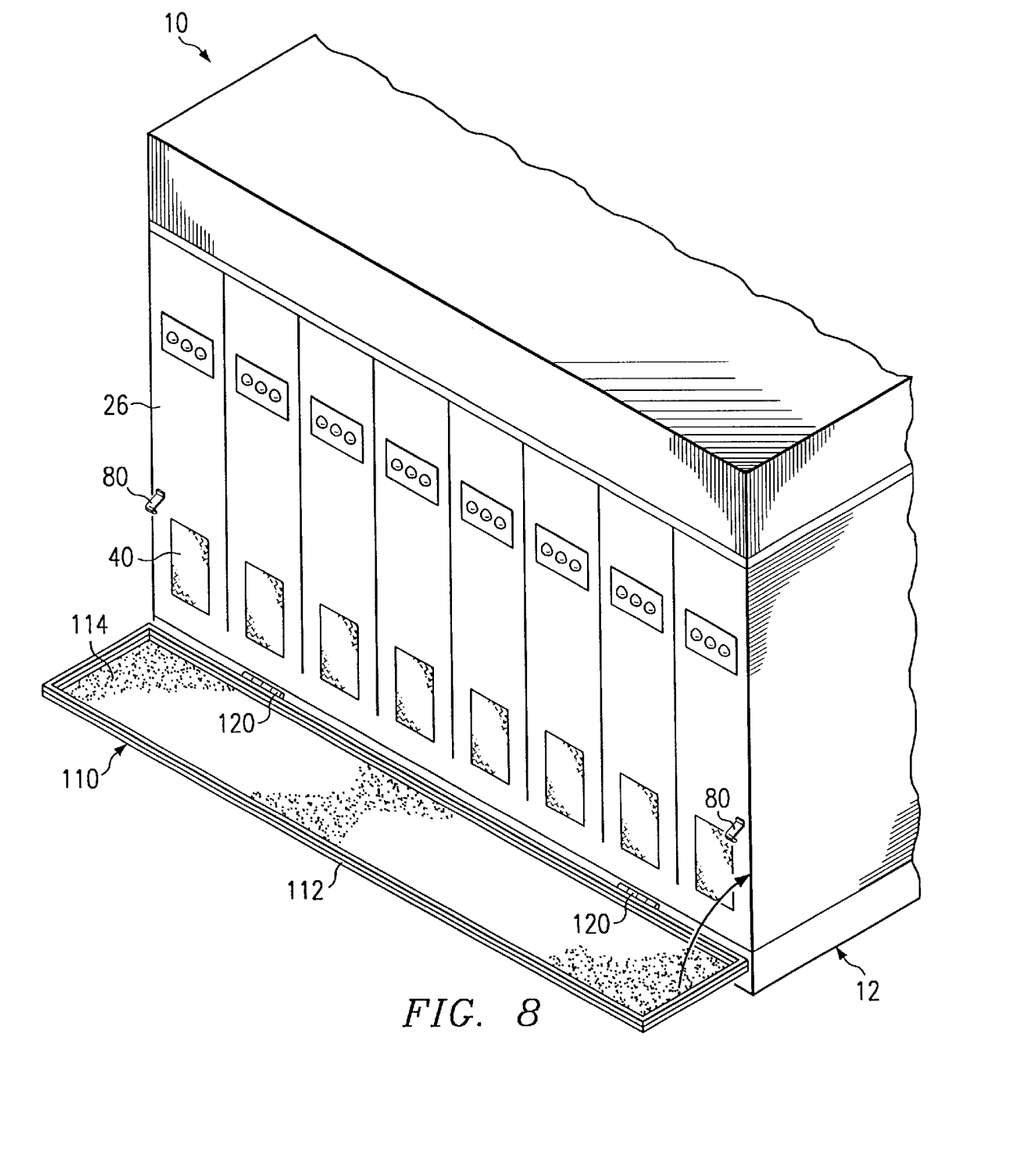
FIG. 8 is a diagram illustrating a card shelf in accordance with another embodiment of the present invention.

FIG. 8 is a diagram illustrating a card shelf assembly 10 in accordance with another embodiment of the present invention. In this embodiment, a plurality of electronic cards 26 having inlets 40 are disposed adjacent each other in a card shelf 12. Filter assembly 110 is rotatably disposed relative to the electronic cards 26 to accommodate enhanced ease of replacement and inspection of filter 114. For example, frame 112 of filter assembly 110 may be rotatably coupled to a support member of card shelf 12, for example, bottom support member 20 and/or support member 28, using hinges 120 or other suitable devices such that filter assembly 110 may be rotated upwardly and downwardly relative to the electronic cards 26 to accommodate inspection and replacement of filter 114. Frame 112 may be removably coupled to electronic card 26 in a closed position using fasteners, clips, or other suitable fastening devices to position filter 114 over inlets 40.

Although the present invention and its advantages have been described in detail, it should be understood that various changes, substitutions, and alterations can be made therein without departing from the spirit and scope of the present invention as defined by the appended claims.

What is claimed is:

1. An electronic card for a card shelf, comprising:
   a circuit board having a plurality of electronic devices coupled thereto;
   a cover plate coupled to the circuit board;
   a diffuser adjacent the circuit board and extending rearwardly from the cover plate; and
   an inlet disposed in the cover plate so that air heated by the electronic devices forms an airflow directed by the diffuser to dissipate a substantial amount of thermal energy generated by the electronic devices.

2. The electronic card of claim 1, further comprising an electromagnetic emission reduction screen disposed proximate the inlet and operable to curtail electromagnetic emissions from the electronic devices.

3. The electronic card of claim 1, further comprising a filter disposed over the inlet and operable to filter outside air entering the inlet.

4. The electronic card of claim 1, further comprising:
   a frame coupled to the cover plate proximate the inlet;
   a gasket disposed between the frame and a portion of the cover plate disposed about the inlet; and
   a filter disposed between the frame and the inlet.

5. The electronic card of claim 1, wherein the diffuser is disposed proximate the inlet and adjacent the circuit board and is operable to distribute the airflow from the inlet in a desired path.

6. The electronic card of claim 5, wherein the diffuser extends rearwardly from the cover plate a predetermined distance to provide a desired airflow path adjacent the circuit board.

7. The electronic card of claim 1, wherein the inlet is disposed on a lower portion of the cover plate.

8. The electronic card of claim 1, wherein the inlet extends upwardly from a lower portion of the cover plate from one-third to one-half a vertical height of the cover plate.

9. The electronic card of claim 1, wherein the diffuser is part of a filter/diffuser assembly removably coupled to the cover plate, the filter/diffuser assembly extending through an opening in a portion of the cover plate to dispose the diffuser of the filter/diffuser assembly adjacent the circuit board.

10. The electronic card of claim 9, wherein the filter/diffuser assembly comprises:
    a frame removably coupled to the cover plate;
    a gasket disposed between the frame and a portion of the cover plate about the inlet;
    a filter disposed between the frame and the inlet; and
    the diffuser coupled to the frame.

11. A card shelf assembly, comprising:
    a backplane;
    a plurality of side support members disposed proximate the backplane;
    a top support member disposed proximate the backplane;
    a bottom support member disposed opposite the top support member, wherein the plurality of side support members, the top support member, and the bottom support member form a shelf area configured to receive electronic cards; and
    wherein at least one of the electronic cards comprises a cover plate having an inlet and a diffuser extending rearwardly from the cover plate and adjacent a circuit board of the electronic card, the inlet disposed in the cover plate of the electronic card so that air heated by the electronic card forms an airflow directed by the diffuser to dissipate a substantial amount of thermal energy generated by the electronic card.

12. The card shelf assembly of claim 11, wherein a plurality of the electronic cards each comprise an inlet operable to receive the airflow to dissipate thermal energy generated by the electronic cards, and wherein the card shelf further comprises a filter assembly removably coupled to the electronic cards operable to filter outside air entering the inlets.

13. The card shelf assembly of claim 12, wherein the filter assembly comprises:
    a frame;
    a gasket disposed between the frame and the cover plates of the electronic cards, the gasket disposed about a periphery of the inlets of the electronic cards; and
    a filter disposed between the frame and the inlets of the electronic cards.

14. The card shelf assembly of claim 13, wherein the frame is removably coupled to the cover plate of at least one of the electronic cards.

15. The card shelf assembly of claim 13, wherein the frame is rotatably disposed relative to the electronic cards, the frame operable rotate upwardly to dispose the filter over the inlets of the electronic cards.

16. The card shelf assembly of claim 11, wherein the electronic card further comprises an electromagnetic emission reduction screen disposed over the inlet to curtail electromagnetic emissions generated by the electronic card.

17. The card shelf assembly of claim 11, wherein at least one of the electronic cards comprises the diffuser disposed proximate the circuit board of the electronic card and operable to diffuse the airflow about the circuit board in a desired path.

18. The card shelf assembly of claim 17, wherein the diffuser extends rearwardly a predetermined distance from the cover plate to provide a desired airflow path adjacent the circuit board.

19. The card shelf assembly of claim 11, wherein the diffuser is part of a filter/diffuser assembly removably coupled to the electronic card, the filter/diffuser assembly operable to filter outside air entering the inlet and diffuse the airflow substantially evenly adjacent the electronic card.

20. The card shelf assembly of claim 19, wherein the filter/diffuser assembly comprises:
a frame removably coupled to the cover plate of the electronic card;
a gasket coupled to the frame and extending about a periphery of the inlet;
a filter disposed between the frame and the inlet; and
the diffuser coupled to the frame and disposed adjacent a circuit board of the electronic card.

21. A method for dissipating thermal energy from a card shelf, comprising:
providing an electronic card disposed in the card shelf;
receiving outside air through an inlet disposed in a cover plate of the electronic card, the inlet disposed such that air heated by the electronic card forms an airflow; and
directing, using a diffuser disposed adjacent the electronic card and extending rearwardly from the cover plate of the electronic card, the airflow to dissipate a substantial amount of thermal energy generated by the electronic card.

22. The method of claim 21, further comprising diffusing the airflow about the electronic card in a desired airflow pattern using the diffuser disposed adjacent the electronic card.

23. The method of claim 21, further comprising filtering the outside air as the outside air enters the inlet.

24. The method of claim 23, wherein filtering the outside air comprises receiving the outside air through a filter disposed over the inlet, wherein a frame is removably coupled to the cover plate to secure the filter over the inlet.

25. The method of claim 21, wherein providing the electronic card comprises providing the electronic card having the inlet disposed in a lower portion of the cover plate.

26. The method of claim 21, wherein providing the electronic card comprises providing the electronic card having the inlet extending upwardly from a lower portion of the cover plate from one-third to one-half a vertical height of the cover plate.

27. The method of claim 21, wherein receiving the outside air through the inlet further comprises receiving the outside air through an electromagnetic emission reduction screen disposed over the inlet to curtail electromagnetic emissions from the electronic card through the inlet.

28. The method of claim 21, wherein the diffuser is part of a filter/diffuser assembly removably coupled to the electronic card to filter the entering outside air and diffuse the airflow substantially evenly about the circuit board.

29. The method of claim 28, wherein the filter/diffuser assembly comprises:
a frame;
a gasket disposed about a periphery of the frame;
a filter within an airflow receiving area of the frame; and
the diffuser coupled to the frame.

30. The method of claim 29, further comprising inserting the filter/diffuser assembly through an opening formed in the cover plate to dispose the diffuser adjacent a portion of the circuit board.

31. The method of claim 21, further comprising diffusing the airflow substantially evenly about the circuit board using the diffuser, the diffuser disposed adjacent the circuit board and extending rearwardly substantially orthogonal to the cover plate.

32. The method of claim 31, wherein diffusing the airflow comprises receiving the airflow through a plurality of perforations formed in the diffuser.

33. The method of claim 31, wherein diffusing comprises:
receiving a portion of the airflow through a plurality of apertures formed in the diffuser; and
receiving a remaining portion of the airflow about a rearward portion of the diffuser.

34. The method of claim 21, wherein at least a plurality of the electronic cards comprise an inlet for receiving the airflow, and wherein the method further comprises providing a filter assembly removably coupled to at least one of the electronic cards, the filter assembly operable to filter the airflow entering each of the electronic cards.

35. The method of claim 34, wherein providing the filter assembly comprises:
providing a frame;
providing a gasket extending about a periphery of the frame; and
providing a filter disposed within an airflow receiving area of the frame.

36. The method of claim 35, wherein providing the filter assembly comprises rotatably coupling the frame to the a support member of the card shelf, wherein the filter assembly is operable to rotate upwardly to position the filter over the inlets.

37. A card shelf assembly, comprising:
a backplane;
side support means disposed proximate the backplane;
top support means disposed proximate the backplane;
bottom support means disposed proximate the backplane, the side, top, and bottom support means forming a shelf area configured to receive electronic cards, the electronic cards adapted to engage the backplane;
means for receiving outside air drawn through a cover plate of at least one of the electronic cards by an airflow, the airflow formed by air heated by the electronic cards; and
means extending rearwardly from the cover plate for directing the airflow to dissipate a substantial amount of thermal energy generated by the electronic card.

38. The system of claim 37, further comprising a means for filtering the airflow.

39. The system of claim 37, wherein the means for diffusing direct the airflow about a circuit board of the electronic card.

40. The system of claim 39, wherein the means for diffusing the airflow is coupled to the cover plate of the electronic card and extends rearwardly from the cover plate a predetermined length.

41. The system of claim 37, further comprising:
means for filtering the airflow received through the cover plate; and
means for shielding electromagnetic emissions from the electronic card.

* * * * *